United States Patent [19]

Datta et al.

[11] Patent Number: 5,759,437
[45] Date of Patent: Jun. 2, 1998

[54] ETCHING OF TI-W FOR C4 REWORK

[75] Inventors: Madhav Datta, Yorktown Heights; Thomas Safron Kanarsky, Hopewell Junction; Gangadhara Swami Mathad, Poughkeepsie, all of N.Y.; Ravindra V. Shenoy, Santa Barbara, Calif.

[73] Assignee: International Business Machines Corporation, Armonk, N.Y.

[21] Appl. No.: 740,569

[22] Filed: Oct. 31, 1996

[51] Int. Cl.$^6$ ............................................. C09K 13/00
[52] U.S. Cl. .................. 252/79.1; 252/79.2; 438/754
[58] Field of Search .................. 252/79.1, 79.2; 438/754

[56] References Cited

U.S. PATENT DOCUMENTS

| | | | |
|---|---|---|---|
| 4,415,606 | 11/1983 | Cynkar et al. | 438/754 |
| 4,787,958 | 11/1988 | Lytle | 438/754 |
| 4,814,293 | 3/1989 | Van Oekel | 438/754 |
| 5,462,638 | 10/1995 | Datta et al. | 156/656.1 |
| 5,462,891 | 10/1995 | Okada | 438/754 |
| 5,508,229 | 4/1996 | Baker | 438/754 |

*Primary Examiner*—Deborah Jones
*Attorney, Agent, or Firm*—Tiffany L. Townsend

[57] ABSTRACT

A chemical etchant for the removal of titanium-tungsten containing structures from the semiconductors and a method for removing the titanium-tungsten. The etchant comprising a solution of hydrogen peroxide, a salt of EDTA, and an acid, the acid capable of preventing the deposition of tin oxide. The method of removal comprises first obtaining a wafer containing titanium-tungsten. Second, immersing the wafer having titanium-tungsten thereon for a predetermined period of time in an etchant bath comprising a solution of hydrogen peroxide, a salt of EDTA and an acid, the acid capable of preventing the deposition of tin oxide. Third, removing the treated wafer and rinsing the treated wafer and lastly, drying the wafer.

17 Claims, No Drawings

5,759,437

1

ETCHING OF TI-W FOR C4 REWORK

FIELD OF THE INVENTION

This invention is related to processes for semiconductor device manufacturing. More particularly, this invention is related to the removal of Ti—W containing structures from semiconductor devices.

BACKGROUND OF THE INVENTION

C4 is an advanced microelectronic chip packaging and connection technology. "C4" stand for controlled collapse chip connection. C4 is also known as "solder bump" and "flip chip".

The basic idea of C4 is to connect chips or chip packages by means of solder balls partially crushed between two surfaces of the units. In C4, the solder balls are formed directly on the metal pads of the one unit. The pads are electrically isolated from other components by the insulating substrate that surrounds each pad. The bottom of the pad is electrically connected into the chip circuit.

The C4 solder balls of the first pad are reflowed and joined to the corresponding locations of the second pad. When the two surfaces are aligned and then pushed together, the soft solder bumps are partially crushed. This allows all the connections to be made in one step, in spite of slight variations in the surfaces.

A known application of C4 is in joining semiconductor microchips (integrated circuits) to chip packages. Chips usually are made in rectangular arrays on a mono-crystalline slab of silicon, called a "wafer," which is a thin disk several inches across. The C4 balls are placed on the chips while they are still joined on a wafer.

C4 allows a very high density of electrical interconnections. Unlike earlier techniques which made connections around the perimeter of a chip or chip package, C4 allows one or more surfaces of a chip or package to be packed with pads. The number of possible connections with C4 is roughly the square of the number that is possible with perimeter connection. Since the C4 balls can be made quite small, about a hundredth of an inch in diameter; the surface density of C4 connections can be on the order of thousands per square inch.

Besides making possible area connection, C4 can also be used with perimeter connection techniques such as tape automated bonding, in which solder balls on a chip are pressed against a pattern of metal foil adhered on a plastic substrate of the chip package. These applications, too, are commercially important.

It will be appreciated that a complex device such as a computer may have dozens of chips and hundreds or thousands of C4 solder ball connections, and the entire device may be useless if only one of the balls fails. The attachment of the C4 balls requires careful design.

Different methods for depositing C4 solder balls exist.

One method of forming solder bumps uses sputtering or vacuum deposition. Solder metal is evaporated in a vacuum chamber.

The metal vapor coats everything in the chamber with a thin film of the evaporated metal. To form solder balls on the substrate, the vapor is allowed to pass through holes in a metal mask held over the substrate. The solder vapor passing through the holes condenses onto the cool surface into rounded solder balls. This method requires a vacuum chamber to hold the substrate, mask, and flash evaporator.

An alternative technique for making solder bumps is electrodeposition, also called electroplating. This method also uses a mask and forms solder bumps only at the selected sites, but the technique is very different from the sputtering method.

Solder bump electrodeposition requires a first preliminary step, the creation of a continuous "seed layer" of conductive metal adhered onto the insulating substrate.

The seed layer is needed to conduct the electricity which deposits solder. A mask is then formed by photolithography.

A layer of photoresist is laid onto the seed layer and exposed to light. Unexposed photoresist can then be washed away to leave the cured photoresist behind as a mask. The mask will show the rows of holes where the solder bumps are to be deposited. Next a lead alloy is electroplated into the mask holes.

A solder bump assembly may contain many layers. For example, the inner, bottommost layer is Ti—W. The next layer is CrCu, the next layer is a layer of Cu, the next layer is an intermetallic layer formed of $Cu_x Sn_y$. The outer uppermost layer is PbSn solder.

An example of a solder bump structure is shown in U.S. Pat. 5,462,638 issued Oct. 31, 1995 to Datta et al and incorporated by reference herein in its entirety.

In the disclosure Datta teaches the use of an etchant to etch the excess metallurgy deposited during the C4 fabrication process without affecting the C4 solder balls. In the disclosure Datta teaches a C4 deposition structure process where a layer of CrCu is deposited on a layer of Ti—W. A layer of Cu is deposited on the CrCu and a solder comprised of PbSn is then deposited on top of the Cu layer. Datta claims an etchant that etches away the Ti—W around the C4 solder balls without significant undercutting of the Ti—W under the C4 balls. The Ti—W under the C4 solder balls acts as a conductive interface. The Ti—W around the C4 solder balls causes erroneous connections and can lead to short circuits. Datta's etchant comprises EDTA, hydrogen peroxide and potassium sulfate. The etchant attacks the Ti—W but does not attack the PbSn solder bumps.

Datta does not suggest a method for reworking a wafer once the C4 balls and etching have occurred. Further, Datta does not suggest the use of an etchant as a mechanism for removing all of the layers deposited during C4 fabrication; or a feasible alternative formulation of the etchant.

Due to the expense and exactness of the C4 deposition process it is desirable to recycle or rework wafers that have incorrect or incomplete C4 deposition. A standard C4 rework method does not exist as prior art. Different segments of the C4 industry tend to deal with the problem of reworking using reclamation methods protected largely by trade secret. Thus there remains a need for a low cost, one step, environmentally method capable of reworking C4 solder ball wafers.

SUMMARY OF THE INVENTION

It is therefore an object of this invention to provide a one step, low cost method to rework C4 technology semiconductor chips.

It is a further object of this invention to provide a method for reworking C4 technology semiconductors using chemicals that minimize the potential negative environmental impact.

In accordance with the above listed and other objects, this invention discloses and claims a chemical etchant for etching of titanium-tungsten alloys, the etchant comprising a mixture of hydrogen peroxide, a salt of EDTA, and an acid, the acid capable of preventing the deposition of tin oxide.

DETAILED DESCRIPTION OF THE PREFERRED EMBODIMENTS

The present invention relates to a method for selectively etching Ti—W films in the presence of Pb-Sn solder. The etchant, and its corresponding process, were developed for C4 fabrication.

The reworking technique of the present invention removes all of the layers involved in the C4 deposition process in one step. The layers below the Ti—W layer are not affected by the rework treatment. The Ti—W layer is etched laterally without concern for undercut. The method is not dependent on the method of C4 deposition. The method can be used with any method of deposition, including, but not limited to, solder alloy vacuum evaporation and electrodeposition techniques.

The rework process is accomplished in a bath maintained at a constant, predetermined temperature. The solution is most active at temperatures ranging from 50° C. to 70° C. The reworking could occur at higher temperatures with slight modifications, however, hydrogen peroxide degrades rapidly at temperatures above 70° C. The bath ingredients include hydrogen peroxide, EDTA and a dicarboxylic acid. The hydrogen peroxide is the actual Ti—W etchant. When Ti—W is exposed to hydrogen peroxide, Ti—W is dissolved and absorbed into solution. Additionally, the Pb-Sn from the solder is attacked by the hydrogen peroxide and dissolved into solution.

EDTA, a salt of ethylenediaminetetraacetic acid is used to form a complex with tungsten (W). K-EDTA minimizes undesirable reactions that can occur if Na containing solutions are used, like Na-EDTA.

The dissolution of the PbSn presents a problem in that the hydrogen peroxide also reacts with the tin (Sn) and tin oxide is formed. Dissolution of tin from the solder and its accumulation in solution, its oxidation and subsequent deposition on unetched metal layers make it difficult to completely etch off the all the necessary layers.

A dicarboxylic acid was included as part of the bath solution of this invention to alleviate the tin oxide deposition problem. The dicarboxylic acid prevents the formation and deposition of tin oxide.

In a preferred embodiment, the salt of EDTA would be in the form of K-EDTA. K-EDTA minimizes problems due to electron migration which can be a significant factor when the C4 solder balls are closely spaced. Also, in a preferred embodiment the dicarboxylic acid would be in the form of oxalic acid.

In the most preferred embodiment, the bath solution would contain 30 grams of K-EDTA mixed with 10 grams of oxalic acid. 30% hydrogen peroxide would then be added to make 1 liter of solution. In yet another most preferred embodiment the bath temperature would be approximately 60° C.

A C4 wafer that needs to undergo a reworking procedure would undergo the following process: first the wafer would be immersed in the rework bath described above for a predetermined period of time. The wafer is then rinsed thoroughly. A vigorous spray is needed to completely lift all of the selected layers from the underlying salvageable wafer surface. The wafer would then be actively dried.

In a preferred embodiment the rinse comprises deionized water. In a more preferred embodiment the deionized water rinse is administered using a combination of spraying the deionized water on the wafer using a high pressure nozzle and forcefully dipping the wafer in the deionized water; the wafer is then dried with a combination of blowing and spinning using an inert gas. In a most preferred embodiment the combination spray/dip rinse process is continued for at least four minute and the wafer is blown and spun dry using nitrogen.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed:

1. A chemical etchant for etching of titanium-tungsten alloys, the etchant comprising:

a solution of hydrogen peroxide, a salt of EDTA, and an acid, the acid capable of preventing the deposition of tin oxide.

2. The etchant according to claim 1, wherein the salt of EDTA is K-EDTA.

3. The etchant according to claim 1, wherein the acid is a dicarboxylic acid.

4. The etchant according to claim 3, wherein the dicarboxylic acid is oxalic acid.

5. The etchant according to claim 1, wherein the etchant comprises about 30 grams/liter K-EDTA, and about 10 grams/liter oxalic acid dissolved in about 30% by weight aqueous hydrogen peroxide.

6. A process for reworking an etched titanium-tungsten alloy, comprising the steps of:

a) obtaining a wafer having titanium-tungsten thereon;

b) immersing the wafer in an etchant bath comprising a solution of hydrogen peroxide, a salt of EDTA, and an acid, the acid capable of preventing the deposition of tin oxide;

c) removing the treated wafer and rinsing the treated wafer; and d) drying the wafer.

7. The process according to claim 6, wherein the temperature of the etchant bath is between 50°–70° C.

8. The process according to claim 7, wherein the temperature of the etchant bath is about 60° C.

9. The process according to claim 6, wherein the acid is a dicarboxylic acid.

10. The process according to claim 9, wherein the acid is oxalic acid.

11. The process according to claim 6, wherein the salt EDTA is K-EDTA.

12. The process according to claim 6, wherein the etchant comprises about 30 grams/liter K-EDTA, and about 10 grams/liter oxalic acid dissolved in about 30% by weight aqueous hydrogen peroxide.

13. The process according to claim 6 wherein the wafer is then rinsed with a liquid consisting essentially of deionized water.

14. The process according to claim 13, wherein the deionized water rinse comprises a combination of spraying the treated wafer with deionized water followed by dipping the wafer in deionized water.

15. The process according to claim 14 wherein the rinse is continued for at least 4 minutes.

16. The process according to claim 6, wherein the wafer is dried by blowing and spinning the wafer using an inert gas.

17. The process according to claim 16, wherein the gas is nitrogen.

* * * * *